United States Patent [19]

Masuda et al.

[11] 4,276,499
[45] Jun. 30, 1981

[54] ROTARY ACTUATOR

[75] Inventors: Noboru Masuda; Masakazu Sugimoto, both of Tokyo, Japan

[73] Assignee: Denki Onkyo Company, Limited, Tokyo, Japan

[21] Appl. No.: 43,226

[22] Filed: May 29, 1979

Related U.S. Application Data

[62] Division of Ser. No. 856,176, Nov. 30, 1977.

[30] Foreign Application Priority Data

Nov. 30, 1976 [JP] Japan .................................. 51-144474
Dec. 21, 1976 [JP] Japan .................................. 51-171307

[51] Int. Cl.$^3$ ............................................... H02P 1/02
[52] U.S. Cl. ..................................... 318/119; 318/653
[58] Field of Search ............ 310/46, 49 R, 156, 36–39; 318/254 A, 439, 653, 696, 127, 119, 138, 254

[56] References Cited

U.S. PATENT DOCUMENTS

| | | | |
|---|---|---|---|
| 3,221,191 | 11/1965 | Cuches et al. .......................... | 310/39 |
| 3,226,639 | 12/1965 | McAdam .............................. | 318/653 |
| 3,801,844 | 4/1974 | Steel ..................................... | 310/49 |

FOREIGN PATENT DOCUMENTS 683383  3/1964 Canada ...................................... 310/36

OTHER PUBLICATIONS

IBM Technical Disclosure Bulletin, M. R. Mathers, Use of Hall Effect Devices in Nkc and Indicating Means, vol. 12, #12, 5/70.

Primary Examiner—Gene Z. Rubinson
Assistant Examiner—John W. Redman
Attorney, Agent, or Firm—Armstrong, Nikaido, Marmelstein & Kubovcik

[57] ABSTRACT

A rotary actuator comprise a stator defining a cylindrical space and formed with a pair of diametrically opposite main magnetic poles adapted to be magnetized to the same polarity, a pair of drive coils disposed on the main poles, a drive circuit for energizing the drive coils, and a rotor having a plurality of pairs of magnetized zones separated by non-magnetized zones, all disposed around the circumference of the rotor, adjacent magnetized zones being of opposite polarities.

14 Claims, 9 Drawing Figures

ROTARY ACTUATOR

This is a division of application Ser. No. 856,176, filed Nov. 30, 1977.

FIELD AND BACKGROUND OF THE INVENTION

The invention relates to a rotary actuator, and more particularly to a rotary actuator having a permanent magnet rotor capable of an angular movement through a given angle within a predetermined limit in a desired direction and which finds its applications in controlling the position of a needle or a cloth feeder of a sewing machine or driving a galvanometer or a pen recorder.

A rotary actuator is already known which operates on the principle of an indicator member of moving coil type. A known rotary actuator comprises a pair of spiral springs attached to and acting on the rotor which are balanced to determine a neutral position and which produce a control torque to counteract a drive torque when the rotor angularly moves in a selected direction from the neutral position. However, the rotary actuator employing a spring is disadvantageous in that a difference between the control torque and the driving torque at the maximum angular displacement of the rotor becomes large and the rotary actuator does not respond quickly. In addition, if a servo control of the rotor is desired, the rotor shaft should be coupled to the potentiometer shaft for cooperative operation, which however is difficult to be positioned with a high accuracy.

SUMMARY OF THE INVENTION

It is an object of the invention to provide a rotary actuator having a permanent magnet rotor which can be held in its neutral position without the provision of spiral springs and which is capable stably holding stationary the rotor with a predetermined torque at the neutral position.

It is another object of the invention to provide a rotary actuator exhibiting a torque response such that the difference between the torque at the neutral position of the rotor and the torque prevailing at the maximum angular displacement is minimized.

Another object of the present invention is to provide a rotary actuator which incorporates a sensor which generates electrical signals in accordance with a rotation angle of the rotor shaft. According to the present invention, the rotary actuator comprises a hollow stator internally provided with a plurality of main magnetic poles or a plurality of main magnetic poles and a plurality of auxiliary magnetic poles, a plurality of drive coils wound around the main magnetic poles and adapted to magnetize the main magnetic poles, a drive circuit for energizing the drive coils, a magnet rotor disposed in a space surrounded by said magnetic poles and supported by a rotation shaft made of a non-magnetic material, and a sensor provided on one end of said rotation shaft to generate electric signals in accordance with a rotation angle of said magnet rotor. The magnet rotor has a plurality of zones having no polarity, that is, non-magnetized zones and a plurality of zones having respective polarities, that is, magnetized zones in an alternating arrangement in a circumferential direction, said magnetized zones being arranged with alternatingly different polarities to perform angular movement within a specified angular range in accordance with a direction and amount of electric current flowing in said drive coils. The sensor which generates electric signals is provided with a magnetic flux generating means, and at least one magnetic resistance effect element, whereby said means forms an area with high flux density which moves in accordance with rotation of said shaft and this area is forced to act on said magnetic resistance effect element to vary the resistance value of the element and convert such variation into an electric signal.

DETAILED DESCRIPTION OF PREFERRED EMBODIMENTS

Figure 1:
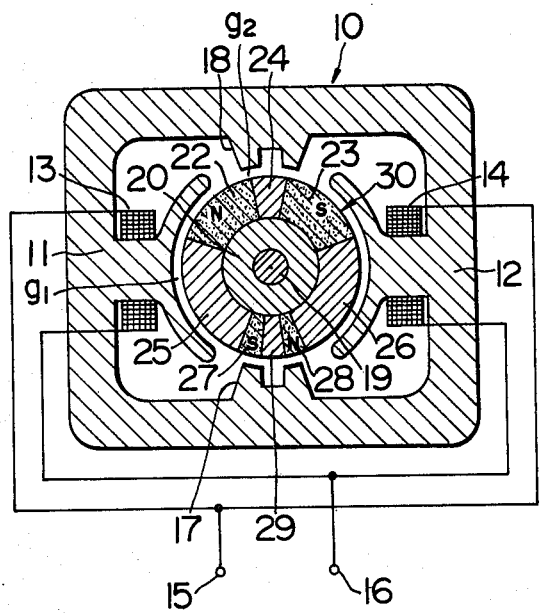
FIG. 1 is a cross section of a rotary actuator, illustrative of the principle of the invention, taken through a plane perpendicular to the axis of the rotor.
Figure 3:
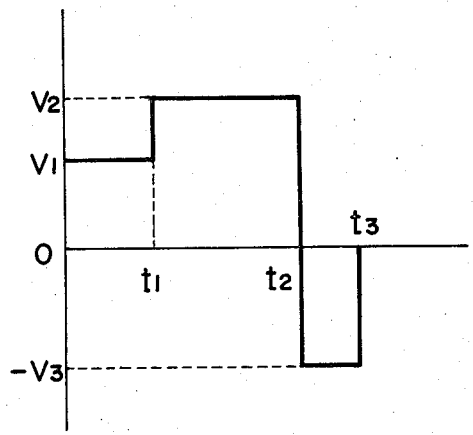
FIG. 3 graphically show a voltage signal applied to a drive coil.

Referring to FIG. 1, the rotary actuator of the invention comprises a hollow stator 10 formed of a magnetic material such as silicon steel including within its cavity a pair of main magnetic poles 11, 12 and a pair of auxiliary magnetic poles 17, 18 and also including a circular compartment formed by these poles, and a rotor 30 disposed within the compartment. The pair of main poles 11, 12 are located diametrically opposite to each other with respect to the rotor 30, and each include a pole piece extending around part of the circumference of the rotor 30 with a gap $g_1$ therebetween. A pair of drive coils 13, 14 are disposed on the base of the respective poles. These coils are connected across a pair of terminals 15, 16 in parallel relationship with each other, and is fed with a voltage signal as shown in FIG. 3, for example, from a drive circuit shown in FIG. 6 as will be further described later, thus exciting the pair of poles 11, 12 to the same polarity. The pair of auxiliary poles 17, 18 are also diametrically opposite to each with respect to the rotor 30, but are angularly displaced 90° from the main poles 11, 12. The pole face of each auxiliary poles 17, 18 is spaced from the rotor 30 by a gap $g_2$ which is of the same length as the gap $g_1$. However, the pole face is formed with a groove extending in the axial direction of the rotor 30.

Figure 2:
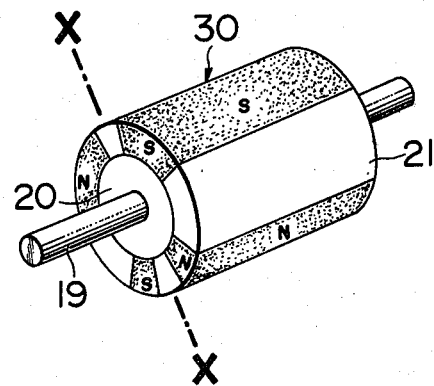
FIG. 2 is a perspective view of the rotor shown in FIG. 1.

The rotor 30 comprises a shaft 19 formed of a nonmagnetic material such as aluminium, a sleeve 20 fitted on the shaft and formed of a paramagnetic material such as pure iron, and a hollow cylinder 21 fitted over the sleeve and formed of a ferromagnetic material such as strontium ferrite. The peripheral surface of the cylinder 21 is divided into magnetized zones 22, 23, 27 and 28 and non-magnetized zones 24, 25, 26 and 29 which appear in alternate fashion around the circumference. In FIGS. 1 and 2, the magnetized zones are dotted for the convenience of distinction. The magnetized zones include a pair of relatively wide main magnetized zones 22, 23 and a pair of relatively narrow auxiliary magnetized zones 27, 28. A first non-magnetized zone 24 is disposed between the pair of main zones 22, 23, which are separated from the pair of auxiliary zones 27, 28 by a second and a third non-magnetized zone 25, 26 of an equal width, with a fourth non-magnetized zone 29 located between the pair of auxiliary zones 27, 28. It is to be noted that the surface of the respective magnetized zones 22, 23, 27, 28 is magnetized to a polarity which is opposite from that of adjacent magnetized zones. The first and the fourth non-magnetized zone 24 and 29 are in a common plane passing through the axis of the rotor 30, and the pair of main zones 22, 23 and the pair of auxiliary zones 27, 28 are disposed in a symmetrical manner with respect to the plane. Thus, the pair of main zones 22, 23 form an isosceles triangle together with the fourth non-magnetized zone 29 which defines the apex of the triangle while the pair of auxiliary zones 27, 28 form another isosceles triangle together with the first non-magnetized zone 24 which defines the apex of the triangle. The first non-magnetized zone 24 has a width which is less than that of the second and the third non-magnetized zone 25, 26, but which is greater than the width of the fourth non-magnetized zone 29. While the described relationship between the magnetized and non-magnetized zones is most preferred, it should be understood that the pair of auxiliary zones 27, 28 may have an equal width to that of the main zones 22, 23 or the width of the fourth non-magnetized zone 29 can be increased to the same width as the first non-magnetized zone 24 in practising the present invention. It is desirable to have a width of the second and the third non-magnetized zones 25, 26 which is greater than the width of the first non-magnetized zone 24. Furthermore, it is desirable that the width of the first and the fourth non-magnetized zones 24, 29 is equal to or greater than five times the gap length $g_1$ between the main poles 11, 12 and the rotor 30. However, it is to be noted that such relationship is dependent on the consideration of the area of the pole face of the main and auxiliary poles.

In the rotary actuator of the invention, when no voltage signal is applied to the drive coils 13, 14, a magnetic attraction occurs between one of the main poles 11, and the main magnetized zone 22 and auxiliary magnetized zone 27, and a similar magnetic attraction occurs between the other main pole 12 and the remaining main and auxiliary magnetized zones 23, 28. Also, a magnetic attraction occurs between the auxiliary pole 18 and the pair of main magnetized zones 22, 23, and a similar magnetic attraction occurs between the other auxiliary pole 17 and the pair of auxiliary magnetized zones 27, 28. As a result of such magnetic interactions, a torque is produced which firmly maintains the rotor 30 in its neutral position shown in FIG. 1. When a voltage signal is applied to the drive coils 13, 14 to excite the main poles 11, 12 to the same polarity, a drive torque will be produced and act on the rotor 30, which therefore angularly moves through an angle of rotation which is proportional to the magnitude of the input voltage. However, a control torque is produced to counteract the drive torque to maintain the rotor in a given position. Specifically, assuming that the main poles 11, 12 are excited to the N-pole in FIG. 1, the auxiliary poles 17, 18 will become S-poles, and the rotor 30 is capable of angularly moving clockwise through an angle within a predetermined maximum angle limitation on the order of 45°.

The operation will be more specifically considered for the application of a voltage signal shown in FIG. 3. When a voltage having a magnitude $V_1$ is applied to the drive coils 13, 14, the rotor 30 angularly moves from the neutral position through an angle of rotation which is proportional to the magnitude of the voltage $V_1$ and will be maintained in the selected position until time $t_1$ when the magnitude of the input voltage increases to a value $V_2$. Thereupon, the rotor 30 incrementally moves and will be maintained in the position reached until time $t_2$ when a negative voltage $-V_3$ is applied. Then the rotor 30 angularly moves in the opposite direction through the neutral position to rotate through an angle of rotation which is porportional to the magnitude of the input voltage $-V_3$. Such angular position is maintained from time $t_2$ to $t_3$. Subsequently when the input voltage is removed, the rotor 30 returns to its neutral position. It should be understood that in the above description, a time lag required for the rotor to angularly move from one position to another is neglected for the convenience of description. The rotary actuator according to the invention can be angularly driven in an incremental manner and in a desired direction depending on the polarity and the magnitude of the input voltage, and can be maintained in the position reached for a duration of the input voltage. When the input voltage to the drive coils 13, 14 is interrupted, the rotor 30 returns from its operative position to the neutral position, where it is constrained. By periodically and alternately changing the polarity of the input voltage, it is possible to achieve a reciprocatory angular movement of the rotor 30 within a defined angle limitation.

Figure 7:
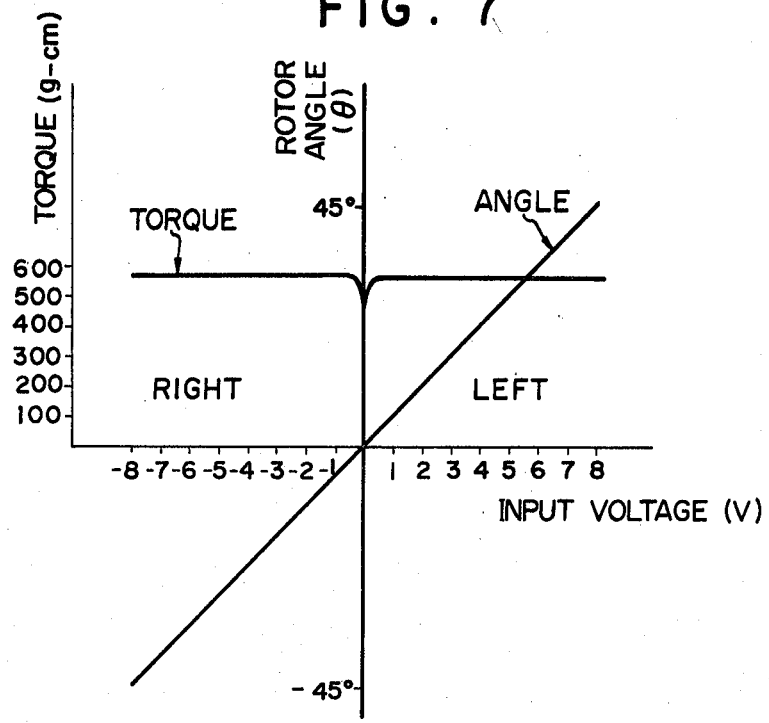
FIG. 7 graphically shows the angle of rotation and torque responses of the rotor plotted against an input voltage applied to the actuator.

FIG. 7 graphically shows a typical response of the rotary actuator of the invention. The abscissa represents the magnitude of an input voltage while the ordinate represent an angle of rotation and the magnitude of torque, respectively. It will be seen that the angle of rotation varies in proportion to the magnitude of the input voltage, and that the torque produced at the respective operative positions is substantially uniform.

Figure 4:
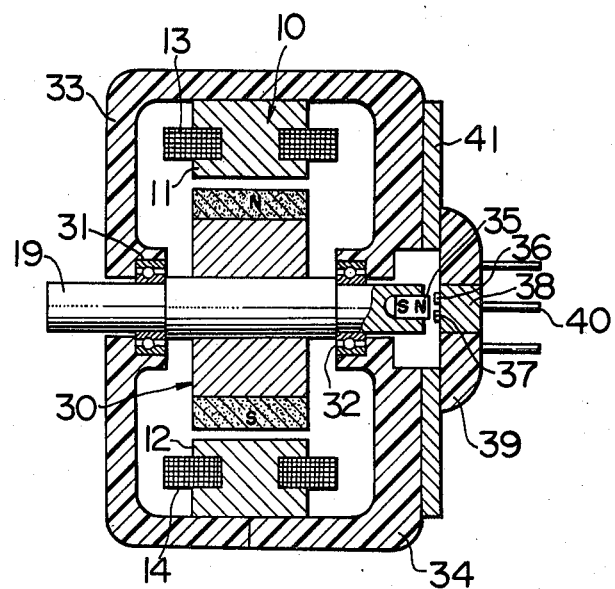
FIG. 4 is a cross section of an embodiment of the invention.

Referring to FIG. 4, there is shown an embodiment of the rotary actuator of the invention where the stator 10 is disposed within a housng comprising a pair of cup-shaped housing halves and a potentiometer is formed jointly by the shaft 19 of the rotor 30 and the housing half 34. The shaft 19 of the rotor 30 is rotatably supported by a pair of bearings 31, 32 which are mounted on the housing halves 33, 34, respectively. A plate 39 made of a plastic material of the permanent magnet 35 which is magnetized axially of the rotor is secured to one end of the shaft 19. A potentiometer 39 including a pair of magnetic resistance effect elements 36, 37 which are spaced from the disposed in opposing relationship with one pole of the permanent magnet 35 is mounted on the outside of the housing half 34 by means of a spacer 41 of a magnetic material. The spacer 41 functions as a magnetic shield which prevents the influence upon the magnetic resistance effect elements 36, 37 of magnetic flux emanating from the rotor 30 and the stator 10 being energized. Briefly describing the construction of the plate 39, it comprises a yoke 38 of a magnetic material which carries the elements 36, 37, and a plurality of terminal pins 40 which are electrically connected with the elements 36, 37. Both the yoke 38 and the terminal pins 40 are molded in a resin block.

Figure 5:
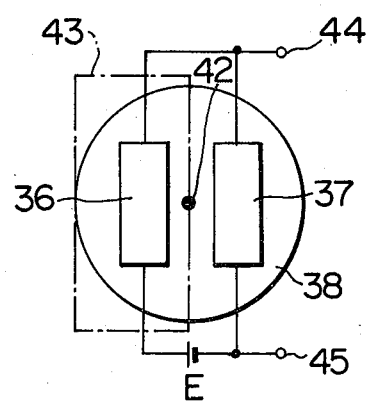
FIG. 5 is a plan view of sensors shown in FIG. 4.

FIG. 5 shows a plan view of the a sensor face of the potentiometer together with a projection thereon of one pole face 43 of the permanent magnet 35 mounted on the shaft 19, which is shown in dotted lines. As will be evident, the pole face 43 has its one side disposed in a plane which passes through the axis 42 of the shaft 19, and the pair of magnetic resistance effect elements 36, 37 are disposed to have a point symmetry with respect to the axis 42. One electrode of the pair of elements 36, 37 is connected with a common terminal 44, while the other electrode of the both elements is connected to the opposite terminals of a d.c. source E, with the other electrode of element 37 being connected with a terminal 45 together with the negative terminal of the source E. As a consequence, when the shaft 19 moves angularly, the area on one of the elements covered by the projection of the pole face 43 will vary in a complementary manner with respect to the area on the other element, and the resulting potential difference develops as an electrical signal across the terminals 44, 45 which is proportional to the angle of rotation of the shaft 19. This signal is utilized as a feedback servo signal in the drive circuit shown in FIG. 6.

Figure 6:
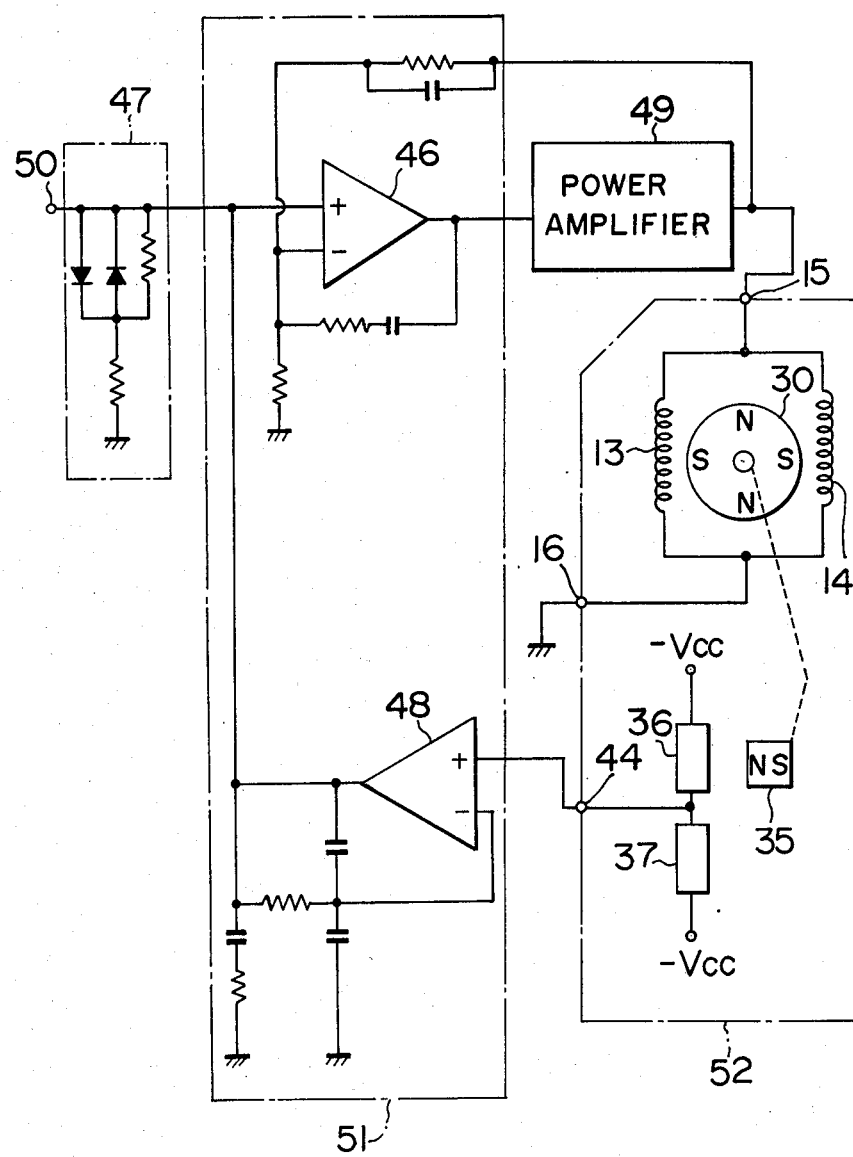
FIG. 6 is a circuit diagram of a drive circuit.

FIG. 6 shows a preferred form of drive circuit which may be used with the rotary actuator of the invention. The drive circuit includes an input terminal 50, to which a voltage signal as shown in FIG. 3 may be applied. The input signal is fed to a compression circuit 47 and thence to the non-inverting input terminal of an operational amplifier 46 which forms a part of a servo amplifier 51. Whenever the input signal exceeds a given level, the compression circuit compacts the signal level in order to limit the maximum angle of rotation of the rotor 30 in the rotary actuator 52. The non-inverting input terminal of the amplifier 46 is also fed with a servo signal to be described later from a feedback amplifier 48. Any difference signal between the input signal fed through the compression circuit 47 and the servo signal is supplied to a power amplifier 49, the output of which is applied to the drive coils 13, 14 of the rotary actuator 52 through the terminals 15, 16. When a voltage signal is applied to the input terminal 50 to cause an angular movement of the rotor 30, the permanent magnet 35 on the rotor shaft produces a complementary change in the magnetic flux applied to the pair of magnetic resistance effect elements 36, 37 which are disposed in opposing relationship with the magnet, thereby producing a signal at the terminal 44 which is porportional to the angle of rotation of the rotor 30. This signal is fed as a servo signal to the operational amplifier 46 through a feedback amplifier 48. It will be seen that the angular movement of the rotor continues until the difference between the input signal and the servo signal supplied to the operational amplifier 46 is eliminated.

Figure 8:
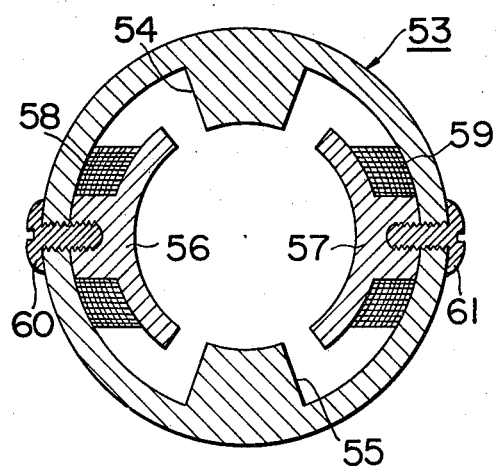
FIG. 8 is a cross section of another example of stator.

FIG. 8 shows an actual example of the stator. Specifically, a stator 53 is integrally formed with a pair of auxiliary magnetic poles 54, 55. A pair of main magnetic poles 56, 57 are separately manufactured, and are secured to the stator by means of set screws 60, 61 after a pair of drive coils 58, 59 are mounted thereon.

Figure 9:
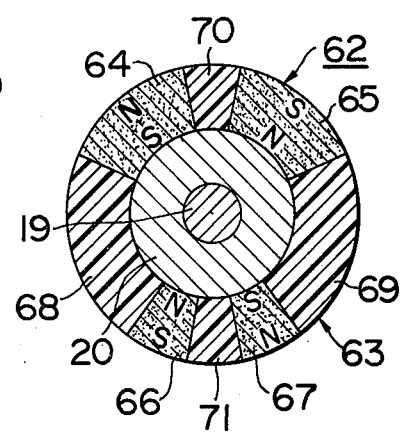
FIG. 9 is a cross section of another example of a rotor.

FIG. 9 shows an example of the rotor. In the example shown, a rotor 62 has a cylinder 63 which is formed by assembly four radially magnetized, anisotropic magnets constituting the magnetized zones 64, 65, 66, 67 together with four plastic, for example, epoxyresin blocks constituting non-magnetized zones 68, 69, 70, 71 in an integral manner. In this manner, the magnetized zones are completely separated from each other by plastic blocks 68, 69, 70, 71.

A rotor actuator has been constructed by the inventors. The rotor has a diameter of 26.4 mm and comprises a shaft on which a pure iron sleeve which is 6.4 mm thick is fitted, and four permanent magnets comprising anisotropic ferrite which define the pair of main magnetized zones and the pair of auxiliary magnetized zones are disposed and integrally bonded together with resin blocks which define the non-magnetized zones. The four anisotropic ferrite magnets have a same size and configuration, each magnet being arcuate in configuration and having a thickness of 7 mm, an axial length of 15 mm and a width of 12 mm. The magnets are radially magnetized. The arcuate magnets which define the pair of main zones are spaced by 110° from each other, and the arcuate magnets which define the pair of auxiliary zones are spaced by 60° from each other. The stator comprises a pair of main poles and a pair of auxiliary poles which are angularly disposed 90° from each other in alternating fashion. The pole face of each main pole subtends an angle of 134° with respect to the center of the rotor while the pole face of each auxiliary pole subtends an angle of 40°. The gap between the pole face and the rotor measures 0.4 mm. The drive coil on each main pole comprises 350 turns of polyester coated copper wire having a diameter of 0.24 mm. By experiments, it is found that the rotor of the rotary actuator exhibited a maximum angle of rotation from the neutral position which is 45°, and its characteristics are substantially the same as that shown in FIG. 7.

The rotary actuator of the invention can be advantageously used as a drive source for controlling the position of a needle or a cloth feeder of an electronic sewing machine by virtue of the response shown in FIG. 7 which it exhibits. In particular, when the sewing pattern signal is at zero level, the needle and the cloth feeder are maintained in their neutral positions with a given torque, so that when the sewing operation is initiated along rectilinear path, no positional error is caused. When sewing along a given pattern, starting from the neutral position prevents or minimizes a distortion of the pattern.

What is claimed is:

1. A rotary actuator having an angular movement in a predetermined angular range said actuator comprising:
(a) a hollow stator made of a magnetic material,
(b) a plurality of main magnetic poles inside said stator,
(c) a plurality of drive coils wound on each of said main magnetic poles and adapted to magnetize said main magnetic poles,
(d) a magnetic rotor positioned in the space surrounded by said main magnetic poles having magnetized zones with alternatingly different polarities and non-magnetized zones arranged therebetween in the circumferential direction, wherein the rotor has an angular movement in accordance with the electric current flowing in said drive coils,
(e) a rotation shaft, of a non-magnetic material, for supporting said rotor,
(f) a magnetic flux generating means provided on one end of said shaft, having an area of high magnetic flux density, said flux generating means moving in accordance with the rotation of said shaft,
(g) at least one magnetic resistance effect element positioned with respect to said magnetic flux generating means in order to detect the angular movement of said shaft and convert said angular movement into an electric signal, (h) means fixed to said stator for supporting said magnetic resistance effect element, (i) means for supplying electric power to said magnetic resistance effect element, (j) detecting means for detecting out an output voltage as a function of the rotation of said magnetic resistance effect element when said shaft rotates together with said magnetic rotor, and (k) means for energising said drive coils such that said magnetic rotor rotates in a predetermined circumferential direction and within a predetermined angular range in accordance with the direction and magnitude of electric current when an electric current flows in said drive coils and said rotor is held stationary with a predetermined control torque at a predetermined position by the attracting force of said magnetic poles when the electric current in said drive coils is zero.

2. A rotary actuator according to claim 1, wherein a plurality of auxiliary magnetic poles are provided between said main magnetic poles.

3. A rotary actuator according to claim 1, wherein said magnetic flux generating means has a permanent magnetic piece provided with polarities in the axial direction positioned on one end of said shaft and said magnetic resistance effect element are positioned opposite one pole of said magnetic piece with a gap therebetween.

4. A rotary actuator according to claim 1, wherein said magnet rotor has a first non-magnetic zone which is arranged between some magnetized zones to isolate adjacent magnetized zones and a second non-magnetic zone, which is wider than said first non-magnetic zone, isolating other adjacent magnetized zones, in an alternating arrangement in the circumferential direction of said rotor.

5. A rotary actuator according to claim 1, wherein said means for supporting the magnetic resistance effect element has a magnetic piece said element being attached to one end thereof and a plate made of a plastic material said magnetic piece being embedded therein with its face having said magnetic resistance effect element exposed.

6. A rotary actuator according to claim 1, wherein said magnetic rotor comprises a cylindrical member comprising a plurality of permanent magnetic pieces forming the magnetized zones and a non-magnetic means forming the non-magnetized zones, and a means for concentrically fixing said cylindrical member on said shaft.

7. A rotary actuator according to claim 6, wherein said non-magnetic means comprises a plastic block.

8. A rotary actuator according to claim 6, wherein said fixing means comprises a cylindrical sleeve made of a permanently magnetic material and mounted on the shaft.

9. A rotary actuator having angular movement in a predetermined angular range said actuator comprising:

(a) a hollow stator made of a magnetic material, (b) a plurality of main magnetic poles inside said stator, (c) a plurality of auxiliary magnetic poles inside said stator positioned between said main magnetic poles, (d) a plurality of drive coils wound on each of said main magnetic poles and adapted to magnetize the main magnetic poles with the same polarity, (e) a magnetic rotor positioned in the space surrounded by said main and auxiliary magnetic poles, (f) an even number of at least four magnetized zones, with alternatingly different polarities, positioned in the circumferential direction on the outer periphery of said magnetic rotor, (g) a plurality of non-magnetized zones comprising a first non-magnetized zone between some of said magnetized zones to isolate adjacent magnetized zones and a second non-magnetized zone, which is wider than said first non-magnetized zone, positioned between others of said magnetized zones to isolate said other adjacent magnetized zones, in the circumferential direction of said rotor, and (h) means for energising said drive coils such that said magnet rotor has an angular movement in a predetermined circumferential direction and within a predetermined angular range in accordance with the direction and magnitude of electric current when an electric current flows in said drive coils and said magnetic rotor is held stationary with a predetermined control torque at a predetermined position by the attracting force of said magnetic poles when the electric current in said drive coils is zero.

10. A rotary actuator according to claim 9, wherein sid magnet rotor comprises a shaft of a non-magnetic material, a cylindrical sleeve, of a permanently magnetic material, mounted on said shaft, and a cylinder, of a highly magnetic material, mounted on said cylindrical sleeve, wherein said magnetized zones are formed on said cylinder.

11. A rotary actuator according to claim 9, wherein said magnet rotor includes four magnetized zones and four non-magnetized zones wherein the non-magnetized zone which isolates a first magnetized zone from a second magnetized zone and the non-magnetized zone which isolates a third magnetized zone from a fourth magnetized zone have a smaller width than the non-magnetized zone which isolates the second magnetized zone from the third magnetized zone and the non-magnetized zone which isolates the fourth magnetized zone from the first magnetized zone.

12. A rotary actuator according to claim 11, wherein the circumferential width of the first and second magnetized zones is larger than the circumferential width of the third and fourth magnetized zones.

13. A rotary actuator according to claim 11, wherein the centers of said first and second magnetized zones and the center of said non-magnetized zones isolating the third magnetized zone from the fourth magnetized zone are positioned respectively at apexes of an isosceles triangle, and the centers of said third and fourth magnetized zones and the center of the non-magnetized zone isolating the first magnetized zone from the second magnetized zone are positioned respectively at another isosceles triangle.

14. A rotary actuator according to claim 9, wherein the circumferential surface of said main magnetic pole which opposes the outer periphery of said magnet rotor is larger than the circumferential surface of said auxiliary magnetic pole which opposes the outer periphery of said magnet rotor.

* * * * *